United States Patent [19]

Takahashi et al.

[11] Patent Number: 5,206,548
[45] Date of Patent: Apr. 27, 1993

[54] NOISE REDUCTION CIRCUIT

[76] Inventors: Satoshi Takahashi, Hitachi Hachimanyama Apartment 537, 1545 Yoshida-cho, Totsuka-ku, Yokohama-shi, Kanagawa-ken; Koji Kamogawa, Hitachi Jonan Heights 101, 5-3-7 Jonan, Fujisawa-shi, Kanagawa-ken, both of Japan

[21] Appl. No.: 716,775

[22] Filed: Jun. 18, 1991

[30] Foreign Application Priority Data

Jun. 18, 1990 [JP] Japan .................................. 2-157521

[51] Int. Cl.$^5$ .......................... H03B 1/00; H03K 5/00
[52] U.S. Cl. ..................................... 307/520; 307/555; 307/268; 307/543; 328/165; 328/167
[58] Field of Search ............... 307/520, 521, 555, 556, 307/268, 542, 543; 328/162, 165, 167, 168, 169

[56] References Cited

U.S. PATENT DOCUMENTS

| | | | |
|---|---|---|---|
| 3,471,719 | 10/1969 | Hughes | 307/542 |
| 3,694,776 | 9/1972 | Linder | 307/520 |
| 4,124,819 | 11/1978 | Hansen | 307/542 |
| 4,544,951 | 10/1985 | Yoshisato | 307/542 |
| 4,571,511 | 2/1986 | Dischert | 307/555 |
| 4,933,578 | 6/1990 | Nishimura | 307/542 |

Primary Examiner—Timothy P. Callahan
Attorney, Agent, or Firm—Antonelli, Terry, Stout & Kraus

[57] ABSTRACT

A noise reduction circuit having an amplification arrangement including first and second voltage-follower amplifiers coupled to a low-pass filter for providing symmetrical push-pull operation on an input signal so that an output voltage offset of an output signal is suppressed. The amplification arrangement provides symmetrical operation substantially independent of temperature.

12 Claims, 8 Drawing Sheets

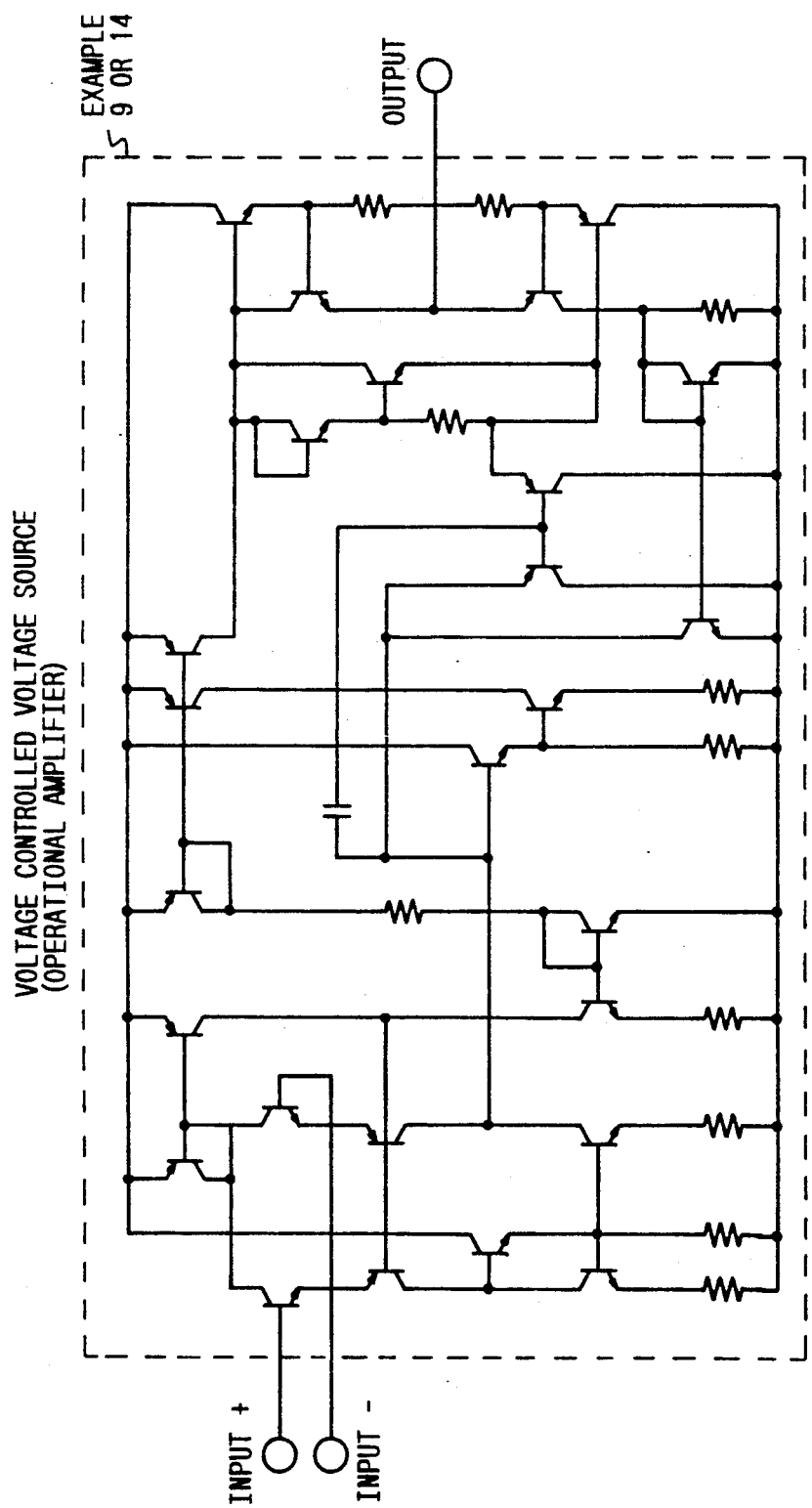

NOISE REDUCTION CIRCUIT

BACKGROUND OF THE INVENTION

The present invention principally relates to a noise reduction circuit for video signal processing for television receivers, VTRs, and the like. More particularly, the present invention relates to a noise reducing circuit suitable for use in noise reduction of the color difference signal and the luminance signal without bringing about an output voltage offset depending on the noise-reduction quantity and temperature variation and not producing a variation in the noise-reduction quantity.

As a conventional example of a noise reducing circuit, an arrangement disclosed in Japanese Laid-open Utility Model Publication No. 58-149832 is commonly known and a basic circuit diagram thereof is shown in FIG. 1. FIG. 2 is a diagram explaining the dependency on the noise-reduction quantity of the output voltage of the circuit of FIG. 1, and FIG. 3 is a diagram explaining the dependency on the ambient temperature of the noise-reduction quantity in the circuit of FIG. 1.

The conventional noise reducing circuit is composed, as shown in FIG. 1, of a push-pull type emitter-follower circuit formed of an NPN transistor 38 and a PNP transistor 39 with their emitters connected with each other, resistors 5 and 6 connected in series between bases of both transistors, current sources 4 and 7 connected to the resistors at their ends on the sides of the bases of both transistors for supplying current to the resistors, a capacitor 17 connected with the output point Ⓑ of the push-pull type emitter-follower circuit, and a resistor 8 provided as a current path for charging and discharging the capacitor 17 from the input point Ⓐ located at the junction of the resistors 5 and 6. In FIG. 1, an NPN transistor 2 and a resistor 3 form an input emitter-follower circuit and a PNP transistor 18 and a resistor 19 form an output emitter-follower circuit.

When $V_{BE}$ of the transistors 38, 39 are represented by $V_{BE}38$, $V_{BE}39$, the resistance values of the resistors 5, 6 by $R_5$, $R_6$, and the current flows from the current sources 4, 7 by $I_1$, $I_2$, respectively, the threshold level at which the transistor 38 on the ⊕ side is turned on is expressed as $(V_{BE}38 - R_5 I_1)$ and the threshold level at which the transistor 39 on the ⊖ side is turned on is expressed as $-(V_{BE}39 - R_6 I_2)$, for a signal with a frequency sufficiently higher than the cutoff frequency of a low-pass filter formed of the resistor 8 and the capacitor 17. The noise-reduction quantity is then expressed as the sum total of such levels, i.e., $$(V_{BE}38 - R_5 I_1) + (V_{BE}39 - R_6 I_2)$$

where $(V_{BE}38 \geq R_5 I_1)$,
$(V_{BE}39 \geq R_6 I_2)$.

When a rising signal with noise superposed thereon is input to the circuit of FIG. 1, the transistor 38 is turned on only when the noise level exceeds the ⊕ threshold level and, during the off-period thereof, the waveform becomes a low-pass signal waveform by means of the resistor 8 and the capacitor 17. Accordingly, there is provided noise reduction at both rising and falling portions of the signal. In the conventional system, since the push-pull circuit is formed of an NPN transistor and a PNP transistor, the threshold level on the ⊕ side and the threshold level on the ⊖ side do not become completely symmetrical. On account of this asymmetry between these transistors, the output DC voltage at the point Ⓑ varies as shown in FIG. 2. Therefore, when such conventional circuit is used as a noise reducing circuit in a television receiver for a color difference signal having high sensitivity to a DC voltage variation, there arises such a problem that the white balance of the television receiver suffers a change depending on the noise-reduction quantity and turning on/off of the circuit. This also leads to a problem of a variation of the black level with the luminance signal. Further, since, as described above, the noise-reduction quantity depends on the voltage $V_{BE}$ of the transistor, there has also been such a problem that the noise-reduction quantity varies with the ambient temperature as shown in FIG. 3.

In the above described prior art, no consideration has been given to the output DC voltage variation or offset depending on the noise-reduction quantity. Therefore, when such a system is used for a noise reducing circuit for a video signal, there arise such problems as production of a variation of the while balance and a variation of the black level, and hence degradation of the image quality of the set. Further, compensation for the temperature characteristic has been insufficient.

SUMMARY OF THE INVENTION

An object of the present invention is to provide a noise reduction circuit having an amplification arrangement including first and second voltage follower amplifiers coupled to a low pass filter, the amplification arrangement providing symmetrical push-pull operation on an input signal so that an output voltage offset of an output signal is suppressed.

Another object of the present invention is to provide a noise reduction circuit with an amplification arrangement suppressing an output voltage offset of an output signal which provides symmetrical operation substantially independent of temperature.

A further object of the present invention is to provide a noise reduction circuit capable of reducing noises in a signal, including maintaining both its rising portion and falling portion, while suppressing the above described DC voltage variation depending on the noise-reduction quantity and compensating for the temperature characteristic of the noise-reduction quantity.

In accordance with the present invention, a push-pull circuit is formed with its push side constructed of a voltage-controlled voltage source whose output is level-shifted by a diode and a current source to a level higher than the input by the voltage $V_f$ of one diode and a diode whose anode is connected with the output, and with its pull side constructed of voltage-controlled voltage source whose output is level-shifted by a diode and a current source to a level lower than the input by the voltage $V_f$ of one diode and a diode whose cathode is connected with the output.

With the described arrangement, the push side and the pull side of the push-pull circuit perform symmetrical operations. Therefore, when the noise-reduction quantity is gradually increased from zero, that is, when the state of potential difference between two inputs of the push-pull circuit and the signal input is changed from that where they are on the same potential level to that where the input on the push side is shifted toward the ⊖ side and the input on the pull side is shifted toward the ⊕ side with respect to the signal input, each output diode changes from its on state toward its cutoff state. Even so, the operating statuses of both the output diodes remain exactly alike. Accordingly, the output of the push-pull circuit at the junction point of the cathode of the output diode on the push side and the anode of the output diode on the pull side remains constant and suffers no change.

When the push side and the pull side are operating, the input and the output are brought to the same potential level by means of the output level-shift diode of the voltage-controlled voltage source and the output diode, and therefore, the sum total of the potential differences between the signal input and each of the inputs to the push-pull circuit becomes the noise-reduction quantity. If such potential differences are combined by resistors and current sources compensated for temperature, it becomes possible to bring the temperature characteristic of the noise-reduction quantity to zero.

These and further objects, features and advantages of the present invention will become more obvious from the following description when taken in connection with the accompanying drawings which show for purposes of illustration only, several embodiments in accordance with the present invention.

BRIEF DESCRIPTION OF THE DRAWINGS

FIG. 9 is a circuit diagram of a voltage controlled voltage source shown as an operational amplifier in FIG. 4;

PREFERRED EMBODIMENTS OF THE INVENTION

Figure 4:
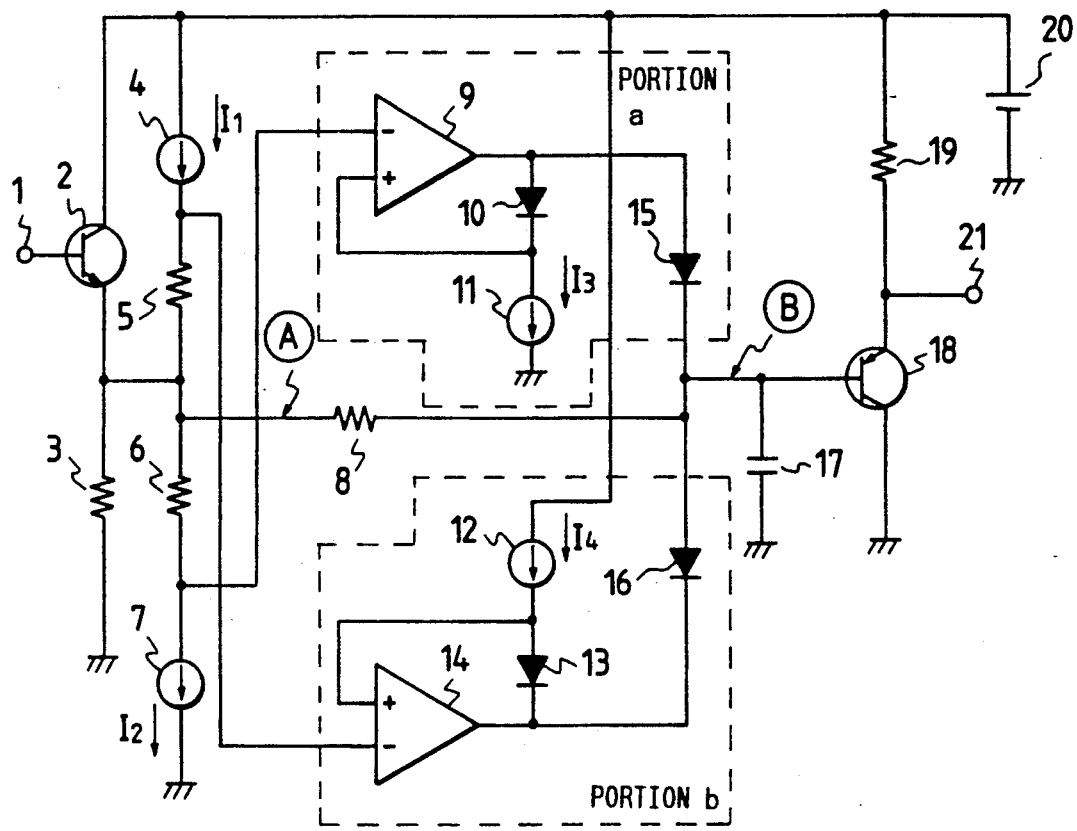
FIG. 4 is a basic circuit configuration diagram of the present invention.
Figure 5:
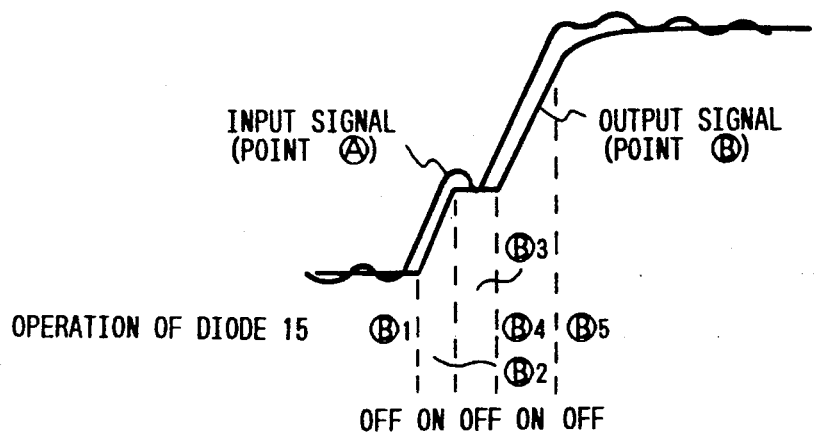
FIG. 5 is a diagram explaining the noise reducing action in the circuit of FIG. 4.
Figure 6:
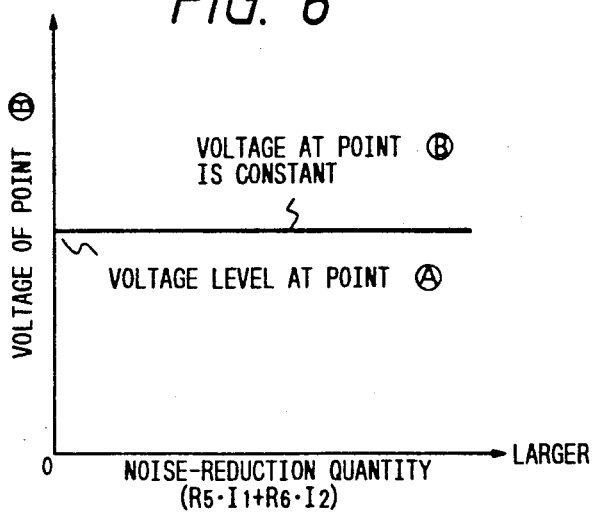
FIG. 6 is a diagram explaining dependency on the noise-reduction quantity of the circuit of FIG. 4.
Figure 7:
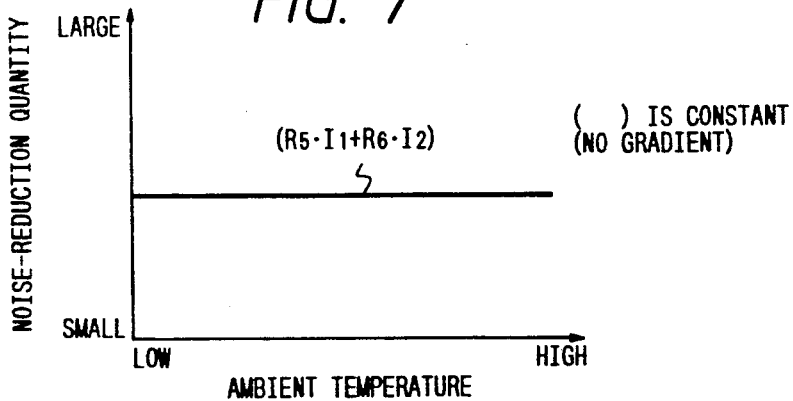
FIG. 7 is a diagram explaining dependency on the ambient temperature of the noise-reduction quantity in the circuit of FIG. 4.

Referring now to the drawings wherein like reference numerals are utilized to designate like parts, FIG. 4 is a circuit diagram showing a basic structure of one embodiment of the present invention and FIG. 5 is a diagram explaining the noise reducing action of the circuit of FIG. 4. Furthermore, FIG. 6 is a diagram explaining dependency of the output voltage of the circuit of FIG. 4 on the noise-reduction quantity, and FIG. 7 is a diagram explaining dependency of the noise-reduction quantity of the same circuit on ambient temperature.

Referring to FIG. 4, a video signal entering the circuit through the signal input 1 is impedance-transformed by an emitter-follower circuit formed of an NPN transistor 2 and a resistor 3 and input to the input (point $\textcircled{A}$) of the noise reducing circuit. The signal input through the emitter-follower circuit is level-shifted by a resistor 6 and a current source 7 and by a resistor 5 and a current source 4 and the level-shifted signals are input to one input ($-$) of two-input voltage-controlled voltage sources 9 and 14, respectively, forming portions of respective voltage-follower amplifiers.

The two-input voltage-controlled voltage source 9, has its output level-shifted by a diode 10 and a current source 11 and has the level-shifted voltage applied to the other input ($+$) thereof, has its output potential higher than the input ($-$) by $V_f$ of the diode, and the same in combination with a diode 15 whose anode is connected with the output thereof constitutes the push side (Portion a) of a push-pull circuit. Similarly, the two-input voltage-controlled voltage source 14, has its output level-shifted by a diode 13 and a current source 12 and has the level-shifted voltage applied to the other input ($+$) thereof, has its output potential lower than the input ($-$) by $V_f$ of the diode, and the same in combination with a diode 16 whose cathode is connected with the output thereof constitutes the pull side (Portion b) of the push-pull circuit.

Thus, in the basic arrangement of FIG. 4, the push-pull circuit is constituted of two sets of two-input voltage-controlled voltage sources, four diodes, and two current sources, and the circuit configuration has symmetrical upper portion and lower portion, and accordingly, if the current flows $I_3$ and $I_4$ from the current sources 11 and 12 are equal, the circuit performs a symmetrical operation.

Further, the circuit is arranged so that the output (point $\textcircled{B}$) of the push-pull circuit where the cathode of the diode 15 and the anode of the diode 16 are connected becomes the input voltage to the operation side in whatever states the push side and the pull side are, by voltage level compensation performed in each of the diodes 10 and 15 and the diodes 13 and 16.

A capacitor 17 is connected to the point e,crc/B/ as the output of the push-pull circuit and a resistor 8 is connected between the point $\textcircled{A}$ as the input of the noise reducing circuit and the point $\textcircled{B}$ the output. When the push-pull circuit is in its off-state, i.e., when both the diodes 15 and 16 are turned off, the resistor 8 functions as the path of the charging and discharging current of the capacitor 17, and by such action of these elements as a low-pass filter, the noise reduction for the signal is achieved.

An emitter-follower circuit formed of a PNP transistor 18 connected to the point $\textcircled{B}$ and a resistor 19 connected with the emitter of the transistor constitutes an output impedance-transformation circuit.

More specifically, the present noise reducing circuit, when the noise has a sufficiently higher frequency than the cutoff frequency of the low-pass filter formed of the resistor 8 and the capacitor 17, attains a noise-reduction quantity expressed as $$R_5 \cdot I_1 + R_6 \cdot I_2,$$

where $I_1$, $I_2$ represent the current flows from the current sources 4, 7, and $R_5$, $R_6$ represent the resistance values of the resistors 5, 6. When the noise has such frequency against which the low-pass filter is not effective, the larger of the signal passed through the low-pass filter and the input signal to the push side (Portion a) whose input voltage has been level-shifted by $R_6 \cdot I_2$ is selected on the ⊕ side, whereas the smaller of the signal-passed through the low-pass filter and the input signal to the pull side (Portion b) whose input voltage has been level-shifted by $R_5 \cdot I_1$ is selected on the ⊖ side.

Figure 1:
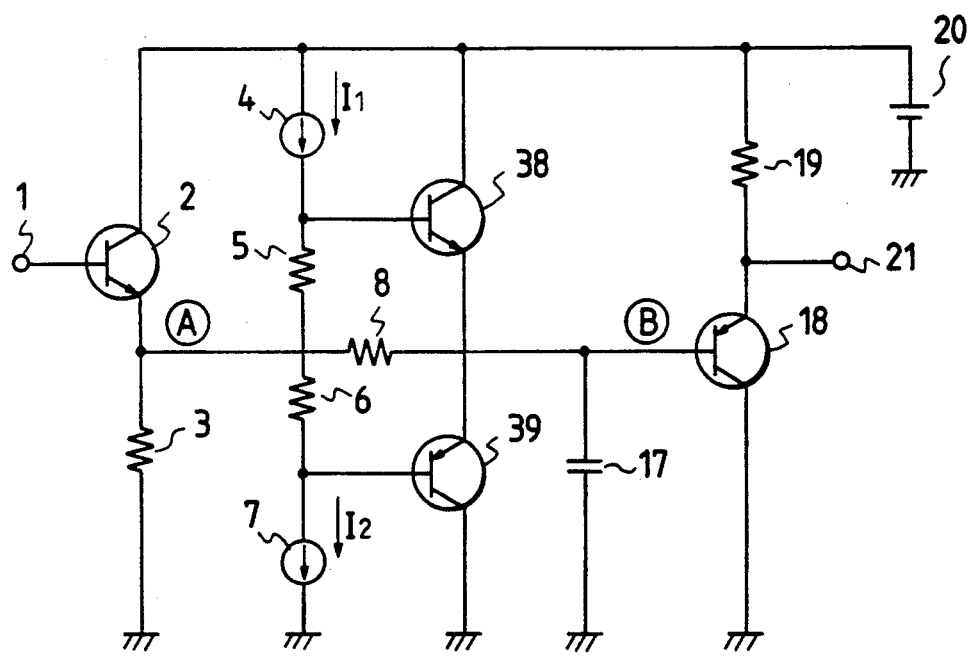
FIG. 1 is a an example of a prior art noise reduction circuit.
Figure 2:
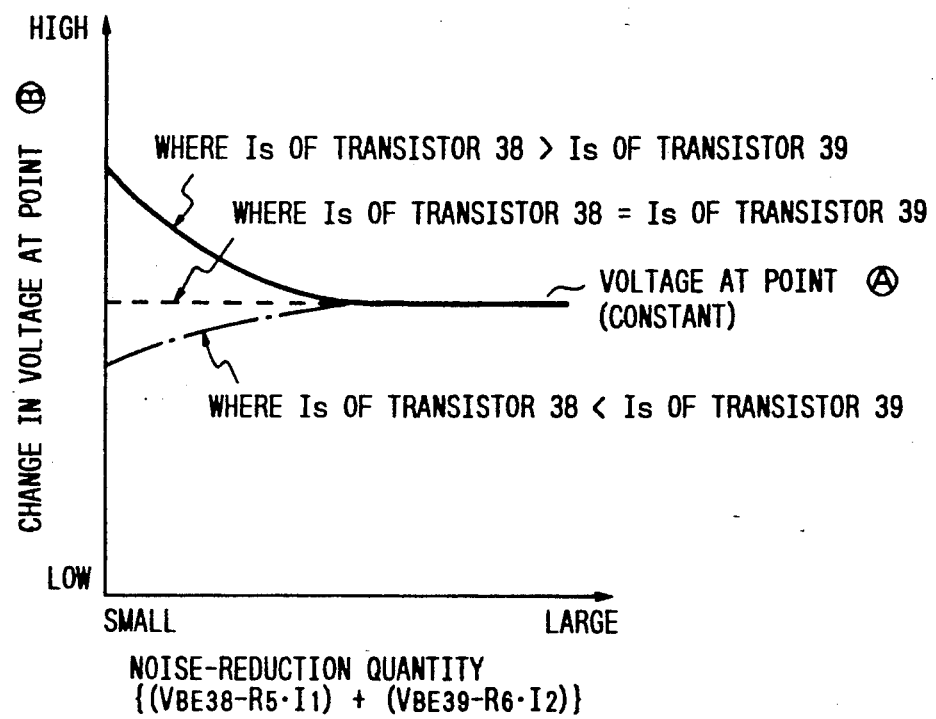
FIG. 2 is a diagram explaining the dependency on the noise-reduction quantity of the output voltage of the circuit of FIG. 1.
Figure 3:
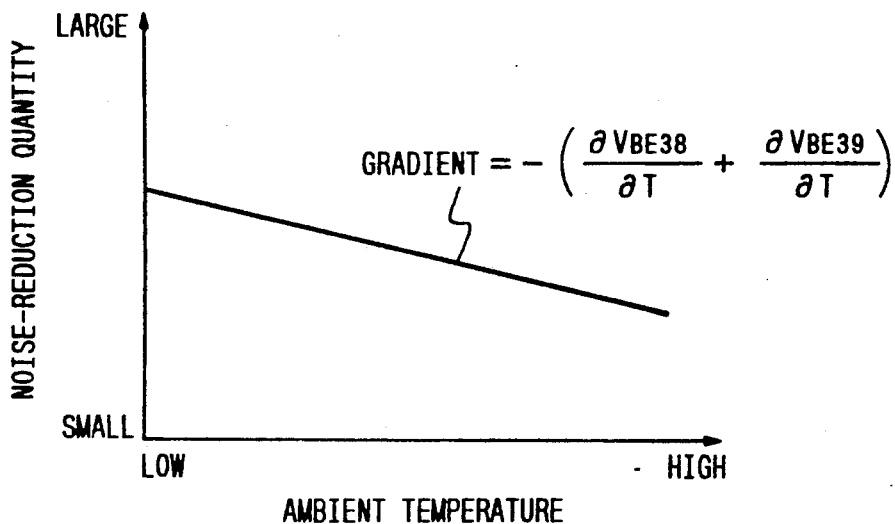
FIG. 3 is a diagram explaining the dependency on the ambient temperature of the noise-reduction quantity in the circuit of FIG. 1.

FIG. 5 is a diagram explaining the noise reducing action of FIG. 4 and it shows an input-output characteristic of a rising signal with noises superposed thereon. Since, as described above, the larger of the signal passed through the low-pass filter and the input signal to the push circuit (Portion a) whose input voltage has been level-shifted by $R_6 \cdot I_2$ is selected, the output takes on the waveform as shown in FIG. 5. The characteristic indicates that the noise reduction is achieved by means of the output diode 15 of the push circuit (Portion a) to be turned on during the periods $\text{Ⓑ}_2$ and $\text{Ⓑ}_4$ at which the level changes in a steep slope and the difference in level between the above two signals exceeds the threshold value $R_6 \cdot I_2$ and, during other periods, the noise reduction is achieved by the low-pass filter effect. Therefore, the noise reduction can be achieved for a signal, inclusive of the rising portion and falling portion, the same as in the prior art circuit of FIG. 1.

FIG. 6 is diagram explaining dependency of the output voltage of the embodiment of FIG. 4 on the noise-reduction quantity, with the noise-reduction quantity, i.e., $R_5 \cdot I_1 + R_6 \cdot I_2$ taken along the abscissa and the output voltage at the point Ⓑ taken along the ordinate.

In the embodiment of FIG. 4, if it is set so that the resistance values of the resistors 5, 6 and the current flows from the current sources 11, 12 are respectively equal, i.e., $R_5 = R_6$ and $I_3 = I_4$ and constant, then the noise-reduction quantity $$R_5 \cdot I_1 + R_6 \cdot I_2$$

only depends on the current flows $I_1$, $I_2$ from the current sources 4, 7, and therefore, by setting $I_1 = I_2$, the noise reducing actions on the ⊕ side and the ⊖ side become symmetrical. Then, if it is set so that $I_1 = I_2 = 0$, the noise-reduction quantity becomes zero and both inputs of the push-pull circuit are brought to the same potential level as that of the point Ⓐ, through currents $I_3 (=I_4)$ flow through the output diodes 15, 16, and the output voltage at the point Ⓑ becomes equal to the voltage at the point Ⓐ as shown in FIG. 6.

If, then, the current flows $I_1 = I_2$ are gradually increased with the voltage at the point Ⓐ kept constant, $R_5 \cdot I_1 + R_6 \cdot I_2$ are increased and the current flows through the output diodes 15, 16 of the push-pull circuit become smaller and finally become zero, or they are brought to a cutoff state. Also in the course of this transition, the current flows through the diodes 15, 16, while decreasing, are always kept equal because of the symmetry in the circuit. Accordingly, the output voltage at point Ⓑ remains equal to the voltage at the point Ⓐ the same as when $I_1 = I_2 = 0$.

FIG. 7 is a diagram explaining the dependency on the ambient temperature of the noise-reduction quantity of the embodiment of FIG. 4, in which the ambient temperature is taken along the abscissa and the noise-reduction quantity is taken along the ordinate. In the embodiment of FIG. 4, the noise-reduction quantity is only dependent on the resistance values of the resistors 5, 6 and the current flows from the current sources 4, 7. Therefore, when the resistors have no temperature characteristic, by making some temperature compensation for the current source 4, 7 for the current flows therefrom, their temperature characteristics can be brought to zero, or when the resistors have some temperature characteristic, by providing the current sources 4, 7 with a temperature characteristic reverse to the temperature characteristic of the resistors, the temperature characteristic of the noise-reduction quantity $$\partial(R_5 \cdot I_1 + R_6 \cdot I_2)/\partial T$$

is enabled to be reduced to zero as shown in FIG. 7. The compensation for the temperature characteristic of the resistor by means of the temperature characteristic of the current source can be attained rather easily by using, for the resistor composing the current source, a resistor with a similar characteristic to that of the resistor to be compensated.

Thus, according to the present embodiment, noise reduction of a signal, inclusive of the varying portions, i.e., the rising portion and falling portion, can be appropriately executed without producing variation or offset in the output DC voltage depending on the noise-reduction quantity and, further, the noise-reduction quantity can be maintained constant independently of the ambient temperature and, hence, a stabilized characteristic can be obtained even if it is applied to a receiver whose working temperature range is wide or large.

Figures 8A, 8B, 8C, 8D:
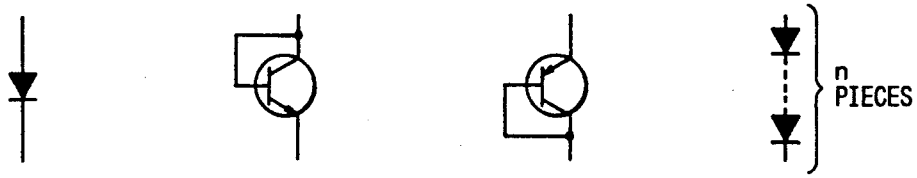
FIGS. 8(a)-(d) show circuit diagrams of diodes of different constructions for use in FIG. 4.

Although the above description was generally directed to the use of diodes, in the practice of actually integrating the circuit, i.e., arranging the circuit into an IC, it is the general practice not to use diodes formed only with a pn junction as shown in FIG. 8(a) but rather to use transistors in place of diodes. The type of the transistor chiefly used is an NPN transistor whose collector and base are shorted as shown in FIG. 8(b) or a PNP transistor whose collector and base are shorted as shown in FIG. 8(c). However, the types in FIGS. 8(a), 8(b), and 8(c) are not completely equal in characteristic, and therefore, when plural kinds of diodes are used for the diodes 10, 13, 15, and 16 in the embodiment of FIG. 4, the symmetry of the circuit is impaired, whereby variation in the output DC voltage or variation in the noise-reduction quantity due to the ambient temperature becomes great. Therefore, by forming the circuit with four diodes all in series, of the same structure, for example, corresponding to the type of FIG. 8(b), the symmetry of the circuit is maintained and its characteristics are stabilized.

According to the described example, diodes of various kinds can be freely chosen provided that their structures are the same. Therefore, the degree of freedom of design is increased, and because of ease in obtaining pairs of similar characteristics, enhancement in performance can be expected. The four diodes in FIG. 4 are each formed of a single diode, but an arbitrary plurality n of diodes connected in series as shown in FIG. 8(d) may be used instead to obtain the same characteristics.

FIG. 9 is a circuit diagram showing a construction of the operational amplifier or two-input voltage-controlled source 9 or 14 of FIG. 4, for example.

Figure 10:
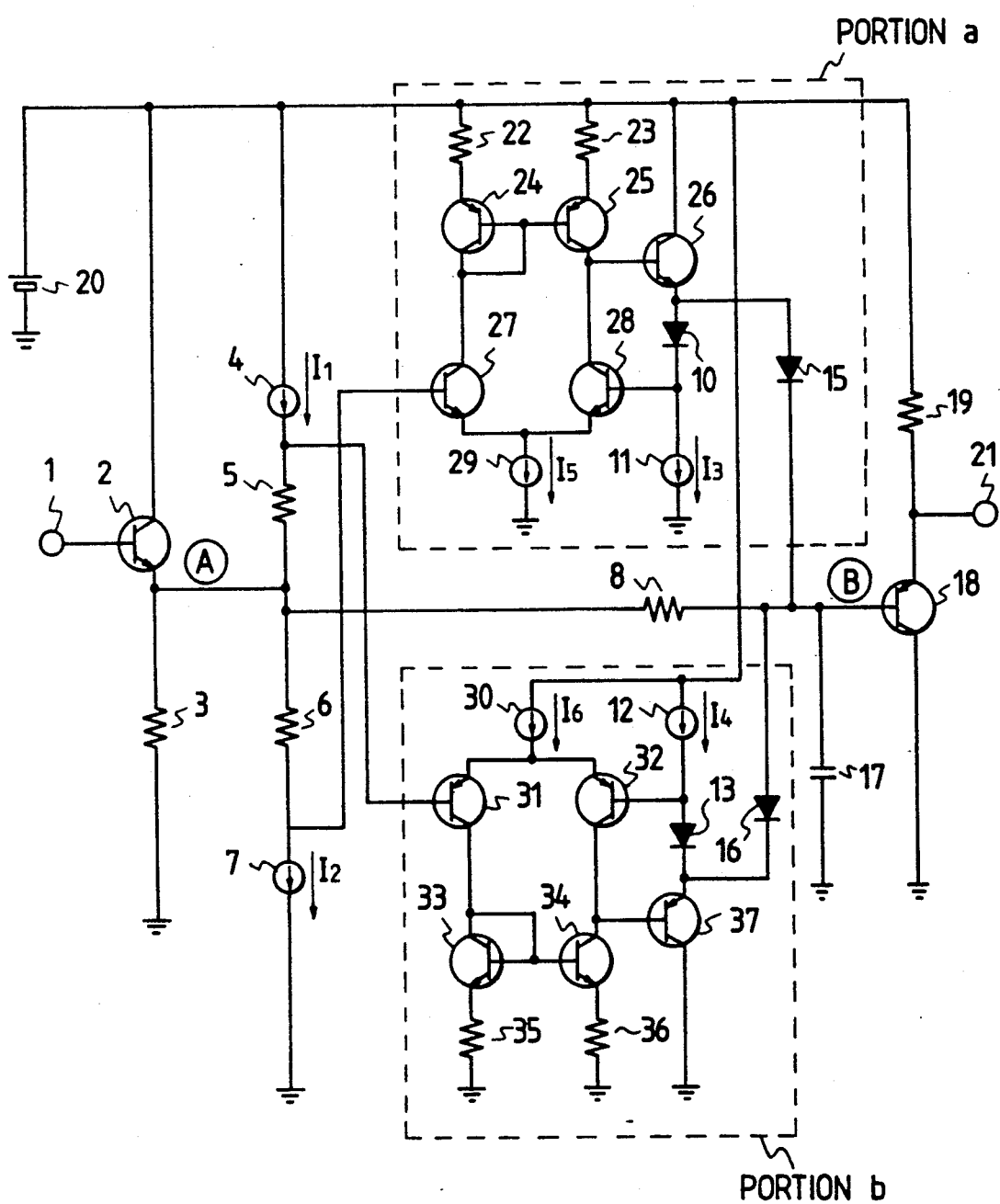
FIG. 10 is a circuit diagram of an embodiment of the present invention having portions encircled by broken lines in the circuit of FIG. 4 replaced with actual circuitry.

FIG. 10 is an embodiment having the push-pull circuit (portion a and portion b) encircled by broken lines in the example of basic structure of the present invention in FIG. 4 and showing an actual circuit construction therefor. In FIG. 10, corresponding parts to those shown in FIG. 4 are denoted by like reference numerals and, further, the push side of the push-pull circuit is encircled as the portion a by a broken line and the pull side is encircled as the portion b similarly by a broken line.

In the present embodiment, the push side as the portion a comprises a differential amplifier formed of NPN transistors 27 and 28 and a current source 29, PNP transistors 24 and 25 connected to the output of the differential amplifier constituting an active load, resistors 22 and 23, an NPN transistor 26 feeding back the output to one of the inputs (the input on the side of the transistor 28), and a current source 11. Further a diode 10 is inserted in the feedback path of a voltage-follower circuit having the base of the transistor 28 as its input and the emitter of the transistor 26 as its output so that the output is higher than the input in potential by the voltage $V_f$ of one diode, and the emitter of the transistor 26 as the output is connected with the anode of an output diode 15. Accordingly, the NPN transistors 26, 27, and 28, the PNP transistors 24 and 25, the resistors 22 and 23, and a current source 29 in the present embodiment constitute the two-input voltage-controlled voltage source 9 in FIG. 4.

The output of the pull side as the portion b is required to be a PNP transistor, and therefor, the transistors used are of reverse polarities to those of the transistors used in the portion a (NPN→PNP, PNP→NPN). Accordingly, the two-input voltage-controlled voltage source 14 in FIG. 4 is formed, in the present embodiment, of PNP transistors 31, 32, and 37, NPN transistors 33 and 34, resistors 35 and 36, and a current source 30 and, further, of a diode 13 connected for level-shifting the emitter potential of the transistor 37 as the output transistor 20 from the potential of the input by the voltage $V_f$ of one diode and a current source 12, and an output diode 16. Therefore, according to the present embodiment, a push-pull circuit using voltage-controlled voltage sources can be realized in a relatively simple configuration. Further, this configuration is suited for arranging into an IC.

Although a first-order low-pass filter formed of the resistor 8 and the capacitor 17 was used as the noise reducing portion in FIG. 4 and FIG. 10, this portion can be replaced with a low-pass filter of an arbitrary multi-order. The same effect can be obtained even if the charging and discharging path is changed from the above described resistor 8 to a current source (of a push-pull type).

Figure 11:
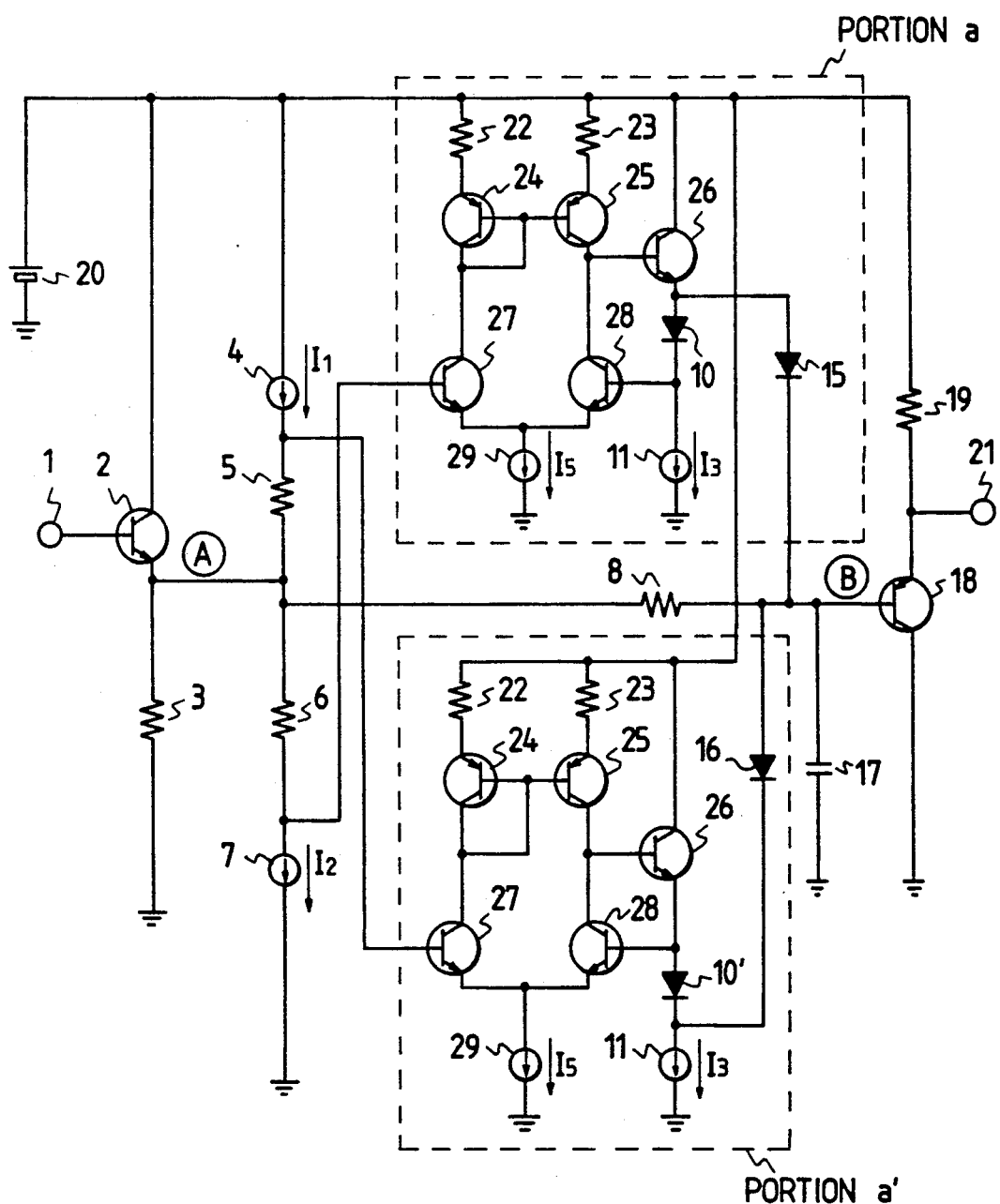
FIG. 11 is a circuit diagram corresponding to FIG. 10 wherein two push type circuits are utilized.
Figure 12:
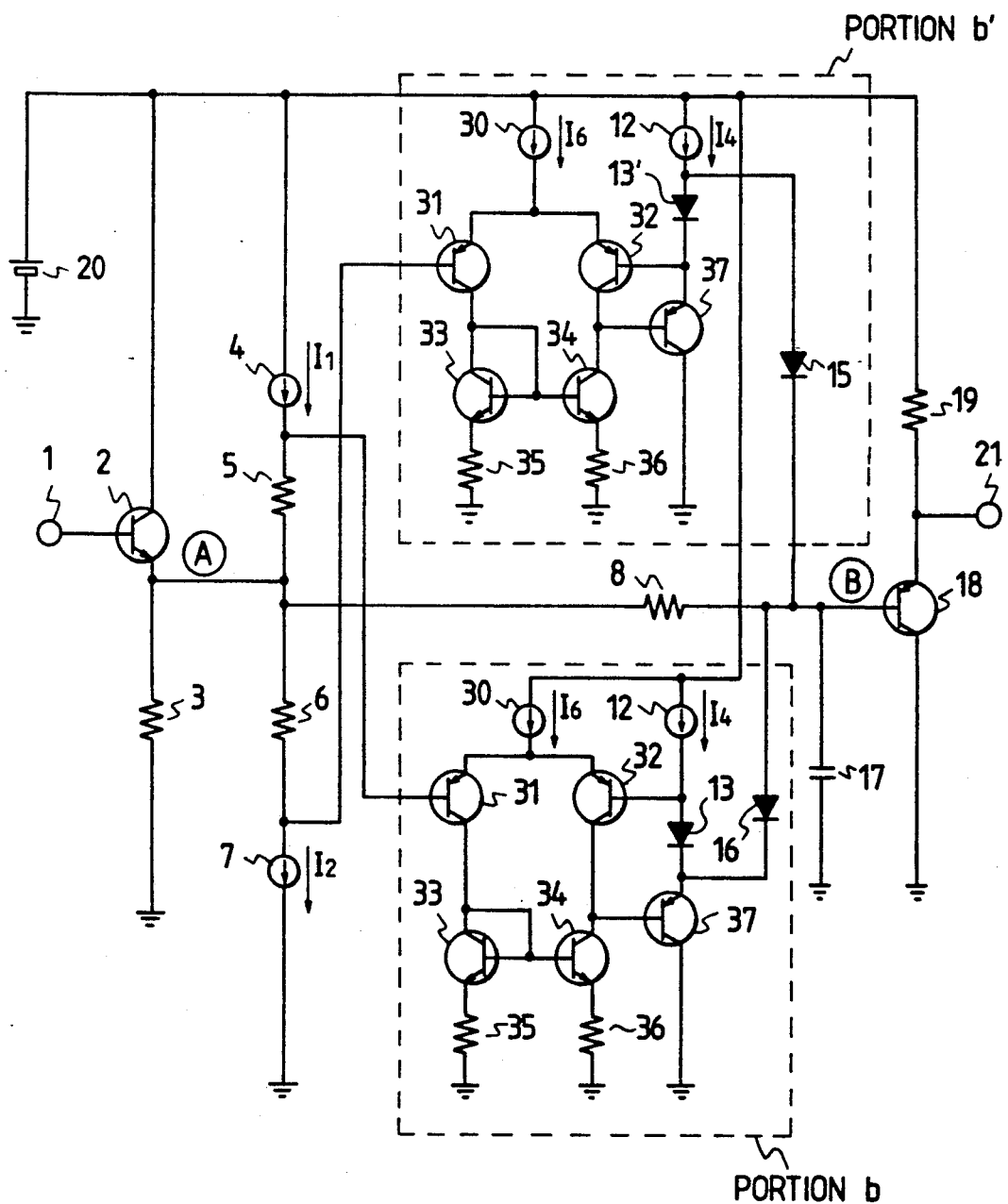
FIG. 12 is a circuit diagram corresponding to FIG. 10 wherein two pull type circuits are utilized.

FIGS. 11 and 12 illustrate different embodiments of the push-pull circuit arrangement operating as described above wherein in FIG. 11, the construction of the push circuit portion a of FIG. 10 is repeated in the bottom part of the circuit as portion a' and connected as shown to operate in the manner of the noise reduction circuit. FIG. 12 illustrates the repetition of thee pull circuit configuration of portion b of FIG. 10 in the top part as portion b' and connected as shown to operate in the manner of the noise reduction circuit.

According to the present invention, as described, noise reduction of a signal, even including its rising and falling portions, can be appropriately performed without causing variation or offset in the output DC voltage depending on the noise-reduction quantity. Therefore, when the present invention is applied to noise reduction for a color difference signal in a television receiver or the like, the white balance of the receiver does not vary even if the noise-reduction quantity is changed or power is turned on/off. When used for noise reduction for a luminance signal in a television receiver, a VTR, or the like, the variation of the black level as was usual with the conventional apparatus does not occur even if the noise-reduction quantity is dynamically and quickly performed and, therefor, a great advantage is obtained in enhancing the image quality of video equipment such as the television receiver and VTR.

Further, since the noise-reduction quantity can be kept constant regardless of the ambient temperature, an advantage can be obtained of maintaining the improvement of the S/N ratio of the receiver constant irrespective of the temperature.

The present invention can be realized in a relatively simple configuration as shown in FIG. 10-12 and it is suitable for arrangement into an IC, and therefore, stabilized characteristics and reduced cost of the products by arranging the circuits in ICs can be expected.

While the present invention has been described in terms of its preferred embodiments, it should be understood that numerous modifications may be made thereto without departing from the spirit and scope of the invention as defined in the appended claims. It is intended that all such modifications fall within the scope of the appended claims.

What is claimed is:

1. A noise reduction circuit comprising amplification means including first and second voltage-follower amplifier means for providing symmetrical push-pull operation on an input signal and low-pass filter means coupled to at least one of an input and output of the amplification means so that an output voltage offset of an output signal of the amplification means is suppressed, wherein the first and second voltage-follower amplifier means providing symmetrical push-pull operation includes first and second two-input voltage-controlled voltage source means, respectively, and wherein the first two-input voltage controlled source means has an output connected with an anode of a first diode, one input of the first two-input voltage-controlled voltage source means being connected with a cathode of the first diode and a first current source for supplying the first diode with a forward current, an other input of the first two-input voltage controlled voltage source means having the input signal of the amplification means supplied thereto, the second two-input voltage-controlled voltage source means having an output connected with a cathode of a second diode, one input of the second two-input voltage-controlled voltage source means being connected with an anode of the second diode and a second current source for supplying the second diode with forward current, an other input of the second two-input voltage controlled source means having the input signal of the amplification means supplied thereto, a third diode having an anode connected with the output of the first voltage-controlled voltage source means, and a fourth diode having an anode connected with the cathode of the third diode, the fourth diode having a cathode connected with the output of the second voltage-controlled voltage source means, a junction of the cathode of the third diode and the anode of the fourth diode serving as the output of the amplification mens, a first and second resistor connected in series between the other inputs of the first and second voltage-controlled voltage source means and the first and second resistors, respectively, and supplying a current flow in a direction from the first resistor to the second resistor so as to determine a noise-reduction quantity, the low-pass filter means including a capacitor connected to the junction of the cathode of the third diode and the anode of the fourth diode serving as the output and a current path connected to a junction of the first and second resistors and to the capacitor and for enabling charging and discharging of the capacitor at the time when the third and fourth diodes are in an off-state.

2. A noise reduction circuit according to claim 1, wherein the current path for the low-pass filter means includes a third resistor provided therein.

3. A noise reduction circuit according to claim 1, wherein the first, second, third and fourth diodes are configured to be of the same type so as to suppress an ambient temperature dependency of the noise reduction circuit.

4. A noise reduction circuit according to claim 3, wherein each of the first, second, third and fourth diodes are formed of a plurality of transistors connected in series.

5. A noise reduction circuit comprising amplification means including first and second voltage-follower amplifier means for providing symmetrical push-pull operation on an input signal and low-pass filter means coupled to at least one of an input and output of the amplification means so that an output voltage offset of an output signal of the amplification means is suppressed, wherein the amplification means includes means for providing symmetrical push-pull operation substantially independent of temperature, and wherein the amplification means providing symmetrical push-pull operation includes a first push circuit means and a second push circuit means connected for providing the symmetrical push-pull operation.

6. A noise reduction circuit comprising amplification means including first and second voltage-follower amplifier means for providing symmetrical push-pull operation on an input signal and low-pass filter means coupled to at least one of an input and output of the amplification means so that an output voltage offset of an output signal of the amplification means is suppressed, wherein the amplification means includes means for providing symmetrical push-pull operation substantially independent of temperature, and wherein the amplification means providing symmetrical push-pull operation includes a first pull circuit means and a second pull circuit means connected for providing the symmetrical push-pull operation.

7. A noise reduction circuit comprising amplification means including first and second voltage-follower amplifier means for providing symmetrical push-pull operation on an input signal and low-pass filter means coupled to at least one of an input and output of the amplification means so that an output voltage offset of an output signal of the amplification means is suppressed, wherein the first and second voltage-follower amplifier means providing symmetrical push-pull operation includes first and second two-input voltage-controlled voltage source means, respectively, and wherein the first two-input voltage controlled source means has an output being an emitter of a first NPN transistor connected with an anode of a first diode, one input of the first voltage-controlled voltage source means being connected with a cathode of the first diode and a first current source for supplying the first diode with a forward current, the one input of the first voltage-controlled voltage source means being a base of a second NPN transistor, an other input of the first voltage-controlled voltage source means being a base of a third NPN transistor having the input signal supplied thereto, the emitters of the second and third NPN transistors being connected to a second current source, the second and third NPN transistors having respective collectors connected to collectors of first and second PNP transistors, respectively, the collector of the second PNP transistor being connected to a base of the first NPN transistor, the second two-input voltage-controlled voltage source means having an output being an emitter of a third PNP transistor connected with a cathode of a second diode, one input of the second voltage-controlled voltage source means being connected with an anode of the second diode and a third current source for supplying the second diode with forward current, the one input of the second voltage-controlled voltage source means being a base of a fourth PNP transistor, an other input of the second voltage-controlled source means being a base of a fifth PNP transistor having the input signal supplied thereto, the fourth and fifth PNP transistors having emitters thereof connected with a fourth current source and having respective collectors connected to collectors of fourth and fifth NPN transistors, respectively, a third diode having an anode connected with an output of the first voltage-controlled voltage source means and a fourth diode having an anode connected with the cathode of the third diode, the fourth diode having a cathode connected with the output of the second voltage-controlled voltage source means, a junction of the cathode of the third diode and the anode of the fourth anode serving as the output of the amplification means, a first and second resistor connected in series between the other inputs of the first and second voltage-controlled voltage source means, a fifth and sixth current source being connected with a junction of the other input to the first and second voltage-controlled voltage source means and the first and second resistors, respectively, and supplying a current flow in a direction from the first resistor to the second resistor so as to determine a noise-reduction quantity, the low-pass filter means including a capacitor connected to the junction of the cathode of the third diode and the anode of the fourth diode serving as the output and a current path connected to a junction of the first and second resistors and to the capacitor and for enabling charging and discharging of the capacitor at the time when the third and fourth diodes are in an off-state.

8. A noise reduction circuit according to claim 7 wherein the current path for the low-pass filter means includes a third resistor provided therein.

9. A noise reduction circuit comprising amplification means including first and second voltage-follower amplifier means for providing symmetrical push-pull operation of an input signal and low-pass filter means coupled to at least one of an input and output of the amplification means so that an output voltage offset of an output signal of the amplification means is suppressed, wherein the first and second voltage-follower amplifier means providing symmetrical push-pull operation includes first and second two-input voltage-controlled voltage source means, respectively, and wherein the first two-input voltage controlled source means has an output being an emitter of a first NPN transistor connected with an anode of a first diode, one input of the first voltage-controlled voltage source means being connected with a cathode of the first diode and a first current source for supplying the first diode with a forward current, the one input of the first voltage-controlled voltage source means being a base of a second NPN transistor, another input of the first voltage-controlled voltage source means being a base of a third NPN transistor having the input signal supplied thereto, the emitters of the second and third NPN transistors being connected to a second current source, the second and third NPN transistors having respective collectors connected to collectors of first and second PNP transistors, respectively, the collector of the second PNP transistor, the second two-input voltage-controlled voltage source means having an output being an emitter of a fourth NPN transistor connected with an anode of a second diode, one input of the second voltage-controlled voltage source means being connected with the anode of the second diode, a third current source connected with a cathode of the second diode, the one input of the second voltage-controlled voltage source means being a base of a fifth NPN transistor, another input of the second voltage-controlled source means being a base of a sixth NPN transistor having the input signal supplied thereto, the fifth and sixth NPN transistors having emitters thereof connected with a fourth current source and having respective collectors connected to collectors of third and fourth PNP transistors, respectively, a third diode having an anode connected with the output of the first voltage-controlled voltage source means and a fourth diode having an anode connected with a cathode of the third diode, the fourth diode having a cathode connected with the cathode of the second diode, a junction of the cathode of the third diode and the anode of the fourth diode serving as the output of the amplification means, a first and second resistor connected in series between the other inputs to the first and second voltage-controlled voltage source means, a fifth and a sixth current source being connected with a junction of the other input to the first and second voltage-controlled voltage source means and the first and second resistors, respectively, and supplying a current flow in a direction from the first resistor to the second resistor so as to determine a noise-reduction quantity, the low-pass filter means including a capacitor connected to the junction of the cathode of the third diode and the anode of the fourth diode serving as the output and a current path connected to a junction of the first and second resistors and to the capacitor and for enabling charging and discharging of the capacitor at the time when the third and fourth diodes are in an off-state.

10. A noise reduction circuit according to claim 9, wherein the current path for the low-pass filter means includes a third resistor provided therein.

11. A noise reduction circuit comprising amplification means including first and second voltage-follower amplifier means for providing symmetrical push-pull operation on an input signal and low-pass filter means coupled to at least one of an input and output of the amplification means so that an output voltage offset of an output signal of the amplification means is suppressed, wherein the first and second voltage-follower amplifier means providing symmetrical push-pull operation includes first and second two-input voltage-controlled voltage source means, respectively, and wherein the first two-input voltage controlled source means has an output being an emitter of a first PNP transistor connected with an anode of a first diode, one input of the first voltage-controlled voltage source means being connected with a cathode of the first diode, a first current source connected with an anode of the first diode, the one input of the first voltage-controlled voltage source means being a base of a second PNP transistor, an other input of the first voltage-controlled voltage source means being a base of the third PNP transistor having the input signal supplied thereto, the emitters of the second and third PNP transistors being connected to a second current source, the second and third PNP transistors having respective collectors connected to collectors of first and second NPN transistors, respectively, the collector of the second NPN transistor being connected to a base of the first NPN transistor, the second two-input voltage-controlled voltage source means having an output being an emitter of a fourth PNP transistor connected with a cathode of a second diode, one input of the second voltage-controlled voltage source means being connected with an anode of the second diode and a third current source for supplying the second diode with forward current, the one input of the second voltage-controlled voltage source means being a base of a fifth PNP transistor, an other input of the second voltage-controlled source means being a base of a sixth PNP transistor having the input signal supplied thereto, the fifth and sixth PNP transistor having emitters thereof connected with a fourth current source and having respective collectors connected to collectors of fourth and fifth NPN transistors, respectively, a third diode having an anode connected with the anode of the first diode, and a fourth diode having an anode connected with a cathode of the third diode, the fourth diode having a cathode connected with the output of the second voltage-controlled voltage source means, a junction of the cathode of the third diode and the anode of the fourth diode serving as the output of the amplification means, a first and second resistor connected in series between the other inputs of the first and second voltage-controlled voltage source means, a fifth and sixth current source being connected with a junction of the other input to the first and second voltage-controlled voltage source mans and the first and second resistors, respectively, and supplying a current flow in a direction from the first resistor to the second resistor so as to determine a noise-rejection quantity, the low-pass filter means including a capacitor connected to the junction of the cathode of the third diode and the anode of the fourth diode serving as the output and a current path connected to a junction of the first and second resistors and to the capacitor and for enabling charging and discharging of the capacitor at the time when the third and fourth diodes are in an off-state.

12. A noise reduction circuit according to claim 11, wherein the current path for the low-pass filter means includes a third resistor provided therein.

* * * * *